(12) United States Patent
Ma et al.

(10) Patent No.: US 12,464,671 B2
(45) Date of Patent: Nov. 4, 2025

(54) MEMORY CASE AND SERVER

(71) Applicant: Beijing Tusen Zhitu Technology Co., Ltd., Beijing (CN)

(72) Inventors: Zhihua Ma, Beijing (CN); Haiquan Li, Beijing (CN); Xipeng Luan, Beijing (CN)

(73) Assignee: Beijing Tusen Zhitu Technology Co., Ltd., Beijing (CN)

( * ) Notice: Subject to any disclaimer, the term of this patent is extended or adjusted under 35 U.S.C. 154(b) by 274 days.

(21) Appl. No.: 18/446,412

(22) Filed: Aug. 8, 2023

(65) Prior Publication Data

US 2024/0057277 A1 Feb. 15, 2024

(30) Foreign Application Priority Data

Aug. 11, 2022 (CN) .......................... 202222115213.1

(51) Int. Cl.
*H05K 7/20* (2006.01)
*H05K 7/14* (2006.01)

(52) U.S. Cl.
CPC ....... *H05K 7/1487* (2013.01); *H05K 7/20727* (2013.01)

(58) Field of Classification Search
CPC ............. H01L 23/4093; H01L 23/3672; H01L 23/367; H01L 23/467; H01L 23/36; H01L 23/40; G06F 1/20; G06F 1/185; H05K 7/20154; H05K 7/20509; H05K 2201/10159; H05K 7/20409; H05K 7/20863; H05K 1/0203; F28F 1/20; F28F 21/084; F28F 2275/08
See application file for complete search history.

(56) References Cited

U.S. PATENT DOCUMENTS

| 5,109,318 | A | * | 4/1992 | Funari | ................ | H05K 7/20509 |
| | | | | | | 257/713 |
| 8,411,443 | B2 | * | 4/2013 | Chen | ......................... | G06F 1/20 |
| | | | | | | 361/720 |
| 2003/0026076 | A1 | * | 2/2003 | Wei | ......................... | H01L 23/36 |
| | | | | | | 257/E23.101 |
| 2006/0067054 | A1 | * | 3/2006 | Wang | ................. | H05K 7/20509 |
| | | | | | | 361/709 |
| 2006/0203454 | A1 | * | 9/2006 | Chang | ................. | H01L 23/3672 |
| | | | | | | 257/E23.103 |

(Continued)

FOREIGN PATENT DOCUMENTS

CN 212322156 U 1/2021

*Primary Examiner* — Mandeep S Buttar
(74) *Attorney, Agent, or Firm* — Perkins Coie LLP

(57) ABSTRACT

A memory case includes a first case body and a second case body. The first case body includes a first extension part extending in a first direction, and the second case body includes a second extension part extending in the first direction. The first case body and the second case body are combined in a second direction to form an interior space for accommodating a memory, and the first extension part secures the second extension part. A length of the first case body in a third direction is different from a length of the second case body in the third direction. The memory module of the server includes a memory slot, a memory, and the above-mentioned memory case. The memory is mounted on the memory slot, and the memory case accommodates the memory.

15 Claims, 8 Drawing Sheets

(56) References Cited

U.S. PATENT DOCUMENTS

| | | | |
|---|---|---|---|
| 2007/0195489 A1* | 8/2007 | Lai | G11C 5/143 |
| | | | 361/600 |
| 2008/0101035 A1* | 5/2008 | Chen | H01L 23/4093 |
| | | | 361/720 |
| 2009/0122481 A1* | 5/2009 | Chang | H01L 23/467 |
| | | | 361/679.54 |
| 2011/0310565 A1* | 12/2011 | He | H01L 23/4093 |
| | | | 361/715 |
| 2022/0053656 A1* | 2/2022 | Lee | G06F 1/187 |
| 2024/0203959 A1* | 6/2024 | Jang | H01L 24/16 |

* cited by examiner

MEMORY CASE AND SERVER

The present application claims priority to and the benefit of Chinese Patent Application No. 202222115213.1, filed on Aug. 11, 2022. The aforementioned application is incorporated by reference herein in its entirety.

TECHNICAL FIELD

The present document relates to a server and, more particularly, to an in-vehicle server.

BACKGROUND

Generally, an in-vehicle server for decision-making and control is provided on an autonomous vehicle for the need of automatic driving.

SUMMARY

The present document provides a memory case applicable to a server structure in an in-vehicle environment for heat dissipation and dust prevention of a memory.

In an aspect of the present document, a memory case is provided for accommodating a memory mounted on a memory slot, including:
 a first case body including a first extension part extending in a first direction; and
 a second case body including a second extension part extending in the first direction, the first case body and the second case body being combined in a second direction to form an interior space for accommodating the memory, and the first extension part securing the second extension part, of which a length of the first case body in a third direction is different from a length of the second case body in the third direction, and the first direction, the second direction, and the third direction are perpendicular to each other.

The present document provides a server capable of achieving heat dissipation and dust prevention of a memory while having a server structure in an in-vehicle environment.

In an aspect of the present document, a server is provided, including:
 a main board; and
 at least one memory module mounted on the main board, the memory module including:
 a memory slot;
 a memory mounted on the memory slot; and
 the memory case described above, the memory case accommodating the memory.

According to the description above and elsewhere in the present document, since the length of the first case body in the third direction is different from the length of the second case body in the third direction, when the memory case accommodates the memory mounted on the memory slot, the shorter one of the first case body and the second case body in the third direction can abut against an upper edge of the memory slot, and there is no need to snap into the space between the memory slot and other devices to shield the memory slot, so that the memory case can be adapted to the interior of a server having structural limitations, thereby achieving heat dissipation and dust prevention for the memory. In addition, since the first extension part of the first case body secures the second extension part of the second case body, the mounted memory case can retain sufficient structural strength to receive vibration in an in-vehicle environment.

BRIEF DESCRIPTION OF THE DRAWINGS

The accompanying drawings, which are incorporated in and constitute a part of this specification, illustrate embodiments and, together with the description, serve to explain exemplary embodiments of the embodiments. It is apparent that the drawings in the following description are only some rather than all embodiments of the present document, and for a person skilled in the art, other drawings can be obtained according to these drawings without involving any inventive effort. Throughout the drawings, the same reference numerals indicate similar, but not necessarily identical, elements.

DETAILED DESCRIPTION

Figure 1:
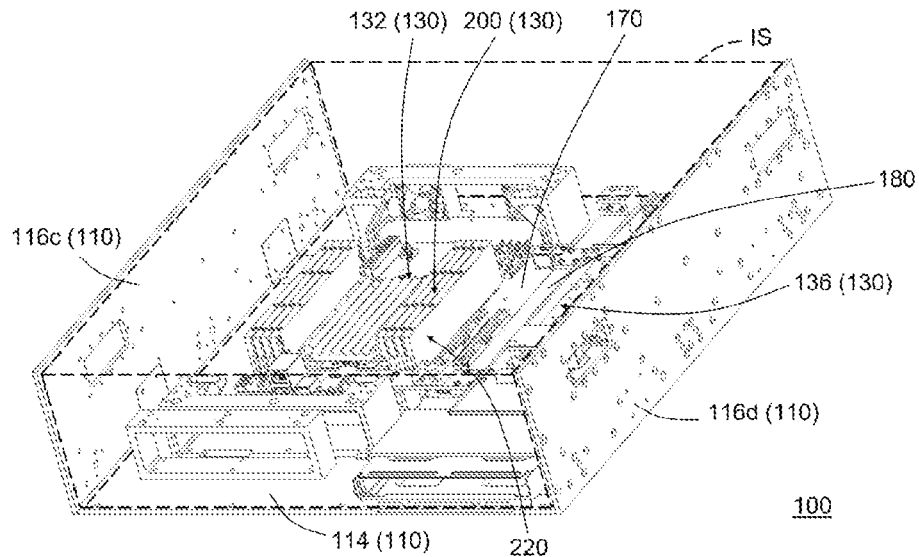
FIGS. 1 to 6 are structural diagrams of a server in a process of assembling according to some embodiments of the present document (some elements are not shown)

In order that those skilled in the art better understand the technical solution of the present document, the technical solution of the embodiments of the present document will be clearly and completely described below with reference to the accompanying drawings of some embodiments of the present document. It is apparent that the described embodiments are only some rather than all embodiments of the present document. Based on some embodiments of the present document, all the other embodiments obtained by those of ordinary skill in the art without involving any inventive effort shall fall within the scope of the present document.

In the present document, the term "plurality" means two or more, unless otherwise specified. In the present document, unless otherwise noted, the use of the terms "first", "second", and the like is intended to distinguish between similar objects and is not intended to limit their positional, temporal, or importance relationships. It is to be understood that the terms so used are interchangeable under appropriate circumstances such that embodiments of the present document described herein are capable of operation in other ways than those illustrated or otherwise described herein.

Generally, an in-vehicle server for decision-making and control is provided on an autonomous vehicle for the need of automatic driving. In-vehicle servers may face different challenges than general servers. The technical complexity involved in the autonomous vehicle imposes a high processing efficiency requirement on the in-vehicle server and need to be implemented on a high-efficiency processor in combination with a proper memory. In addition, to avoid damage to boards or elements due to vibration in an in-vehicle environment, corresponding support boards are provided inside a server chassis to improve structural strength.

To prevent dust generated by a fan from entering the memory while dissipating heat from the memory of the in-vehicle server, a case may be used to cover the memory to achieve heat dissipation and dust prevention for the memory. However, structures such as support boards inside the server chassis limit the space inside the server chassis; as a result, distances between a plurality of memory slots or between a memory slot and other devices must be designed as minimal as possible to reduce the space occupied thereby, which makes the case shielding the memory too thick to be smoothly inserted into and fixed to the surrounding space of the memory slot, rendering poor applicability.

It is a technical problem to be solved urgently by those skilled in the art as to how to configure an appropriate memory case structure applicable to a server structure in an in-vehicle environment for heat dissipation and dust prevention of a memory.

The server provided in some embodiments of the present document can be applied to a vehicle with an automatic driving function or a vehicle with an auxiliary driving function, and can also be applied to a vehicle configured to allow manual driving. The present application does not strictly define the application scenario.

Figure 7:
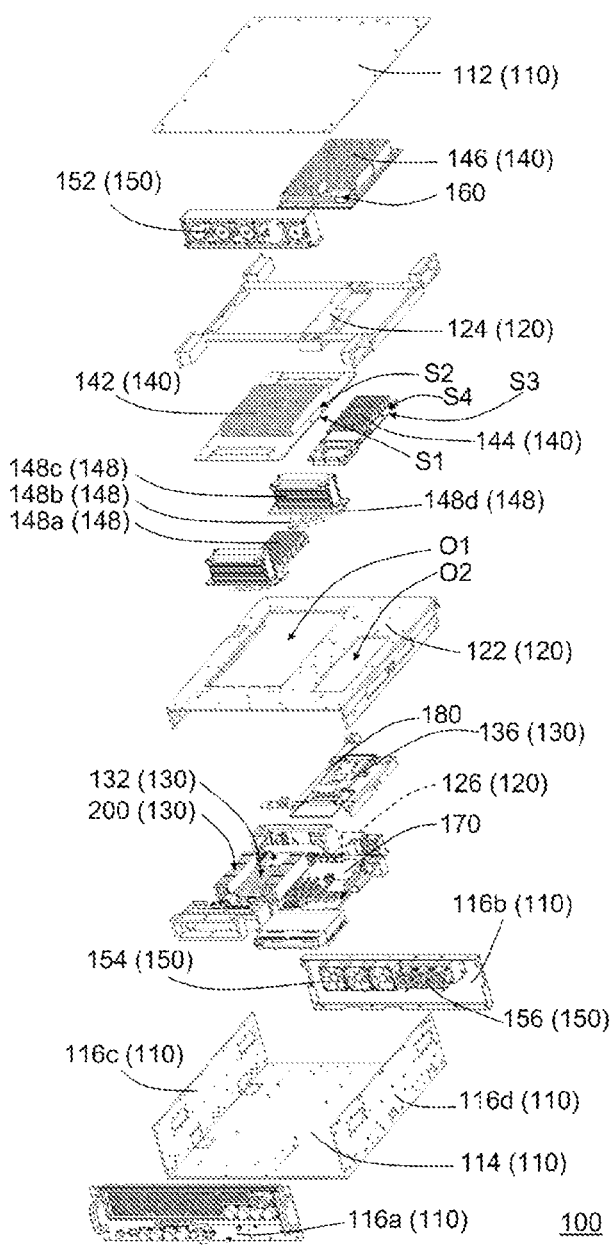
FIG. 7 is an explosion diagram of the server according to some embodiments of the present document.

FIGS. 1 to 6 depict a process of mounting the server 100 in some embodiments of the present document. FIG. 7 is an exploded view of the server 100. At least a portion of the illustrations of FIGS. 1 to 6 and FIG. 7 illustrate an interior structure of the server 100 and a relationship among various elements of the server 100.

Referring to FIGS. 1 and 5 to 7, in the embodiments, the server 100 includes a chassis, i.e., a housing 110. The housing 110 includes, for example, an upper board 112, a lower board 114, and a plurality of sidewalls. These sidewalls include a first sidewall 116a, a second sidewall 116b, a third sidewall 116c, and a fourth sidewall 116d. The first sidewall 116a is opposite the second sidewall 116b, and the third sidewall 116c is opposite the fourth sidewall 116d. The first sidewall 116a is, for example, a front panel of the server 100, and the second sidewall 116b is, for example, a back panel opposite the front panel. Further, the third sidewall 116c, the lower board 114, and the fourth sidewall 116d form a U-shaped board structure. However, these sidewalls may also be provided with other structures or functions according to actual requirements, and the present document is not limited thereto.

In the embodiments, the housing 110 forms an interior space IS. The interior space IS is, for example, a space surrounded by the upper board 112, the lower board 114, the first sidewall 116a, the second sidewall 116b, the third sidewall 116c, and the fourth sidewall 116d. The server 100 further includes a support module 120 in the interior space IS. The support module 120 includes a partition 122 having an opening to divide the interior space IS into a first space IS1 and a second space IS2. The first space IS1 is located below, i.e., on the side of the lower board 114, and the second space IS2 is located above, i.e., on the side of the upper board 112.

Figure 3:
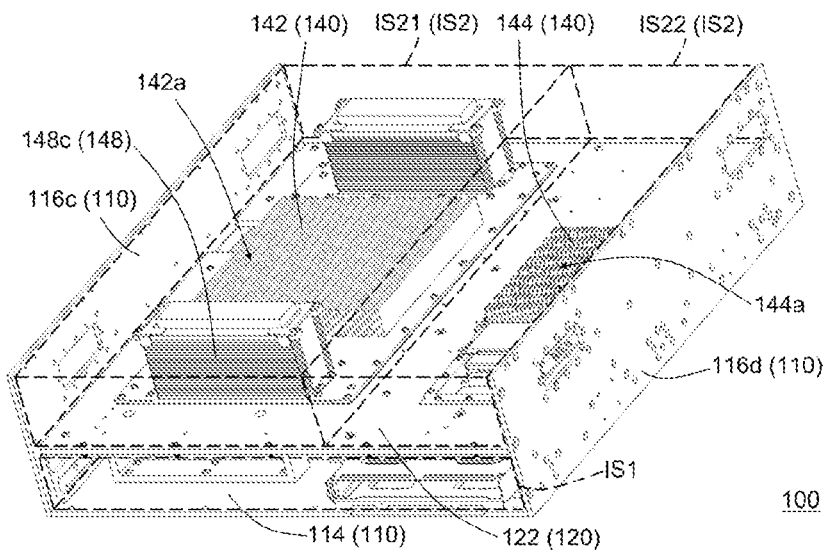

The server 100 further includes a heat-generating element set 130, a heat dissipating unit 140, a main board 170, and a daughterboard 180. The heat-generating element set 130 is located in the first space IS1, and the heat-generating element set 130 includes a central processing unit (CPU) 132 and at least one memory module 200. That is, the main board 170, the CPU 132, and the at least one memory module are located in a lower space (the first space IS1), and the CPU 132 and the at least one memory module 200 are mounted on the main board 170. The heat dissipating unit 140 includes a heat sink, i.e., a first heat sink 142. Referring to FIG. 3, the first heat sink 142 has a heat dissipating structure, i.e., a first heat dissipating structure 142a, to dissipate heat from the heat-generating element set 130 in the first space IS1 and conduct the heat of the at least one memory device 200 to the upper space (the second space IS2).

In the embodiments, the heat sink (the first heat sink 142) and the support module 120 divide the interior space IS into the first space IS1 and the second space IS2. Specifically, the opening of the partition 122 is a first opening O1 and accommodates the first heat sink 142. When the first heat sink 142 is mounted into the first opening O1, the partition 122 and the heat sink (the first heat sink 142) divide the interior space IS (the chassis space of the chassis) of the housing into an upper space (the second space IS2) and a lower space (the first space IS1). The lower board 114, the plurality of sidewalls, the partition 122, and the first heat sink 142 form the first space IS1. The first space IS1 is, for example, a closed space.

Referring to FIGS. 3 and 7, the first heat sink 142 has a first surface S1 facing the first space IS1 and a second surface S2 facing the second space IS2, and the second surface S2 of the first heat sink 142 has the heat dissipating structure (the first heat dissipating structure 142a of FIG. 3). Further, the first surface S1 of the first heat sink 142 contacts the heat-generating element set 130 to dissipate heat from the heat-generating element set 130. Specifically, the first surface S1 of the first heat sink 142 contacts the memory module 200 to dissipate heat from the memory module 200. In some embodiments, the first surface S1 of the first heat sink 142 may also contact the CPU 132 or other elements of the heat-generating element set to dissipate heat therefrom.

Referring to FIGS. 1, 8, 12, and 15, in the embodiments, the memory module 200 includes a memory slot 210, a memory 220, and a memory case 230. The memory 220 is mounted on the memory slot 210, and the memory case 230 accommodates the memory 220. Specifically, the at least one memory module 200 of the server 100 is a plurality of memory modules 200, and the plurality of memory modules 200 are parallel and side by side. The memory case 230 is configured to accommodate the memory 220 mounted on the memory slot 210 such that the memory 220 is covered by the memory case 230. The first surface S1 of the first heat sink 142 contacts the at least one memory case 230 to dissipate heat from the at least one memory case 230. Specifically, FIG. 1 depicts eight memory cases 230 that can accommodate at least one memory 220 to provide heat dissipation and dust protection for the memory 220. The heat generated by the memory 220 may be directed through the memory case 230 to the first heat sink 142 and into the second space IS2. The heat generated by other heat-generating elements of the heat-generating element set 130 may also be directed to the second space IS2 when the first heat sink 142 contacts or is close to these heat-generating elements of the heat-generating element set 130.

Figure 8:
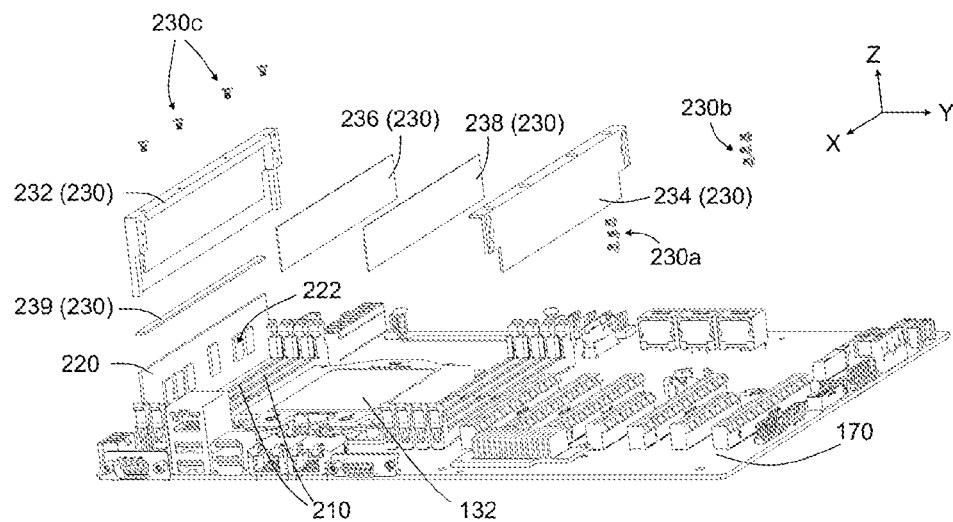
FIG. 8 is an exploded view of elements on a memory case and a main board according to some embodiments of the present document.
Figure 9:
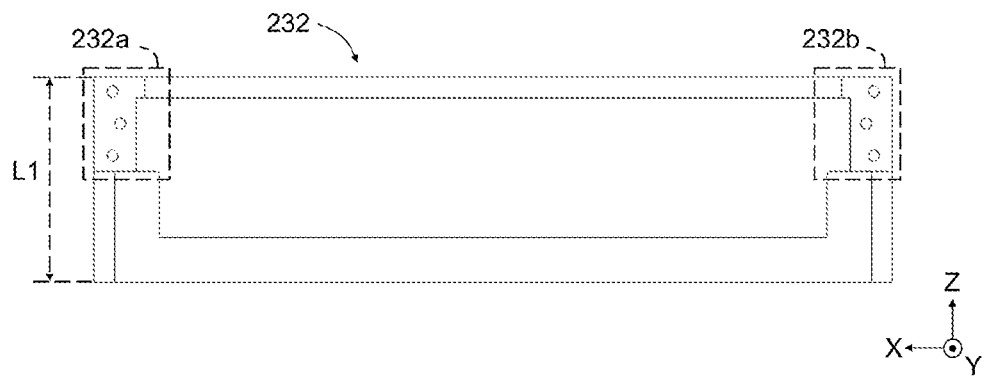
FIG. 9 is a schematic view of an inner surface facing a first case body according to some embodiments of the present document.
Figure 10:
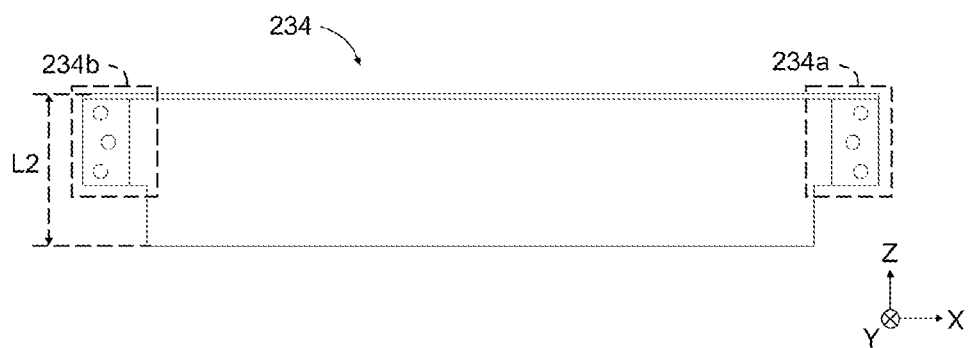
FIG. 10 is a schematic view of the inner surface facing a second case body according to some embodiments of the present document.
Figure 13:
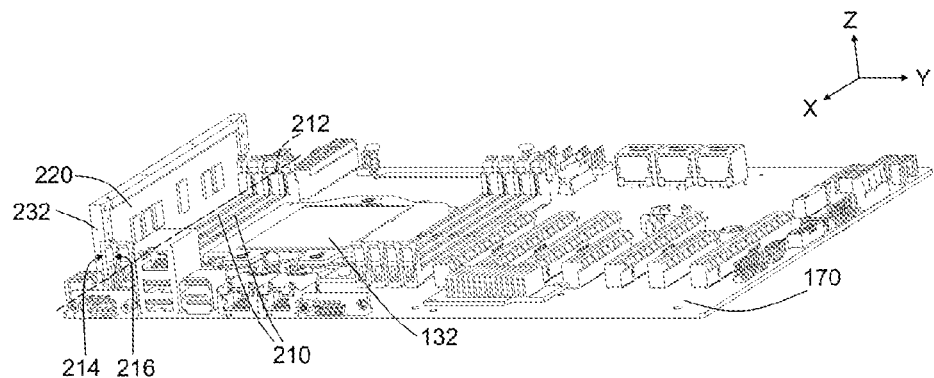

Referring to FIGS. 8 to 10, in the embodiments, the server 100 is located, for example, in a space constructed by a first axis, a second axis, and a third axis that are perpendicular to each other. The first axis extends in a first direction X, the second axis extends in a second direction Y, and the third axis extends in a third direction X. That is, the first direction X, the second direction Y, and the third direction X are perpendicular to each other. Referring to FIG. 13, a central axis 212 of the memory slot 210 is parallel to a mounting direction in which the memory 220 is mounted in the memory slot 210. The memory 220 is, for example, mounted along the central axis 212 of the memory slot 210, and the central axis 212 extends in the first direction X. Furthermore, the second direction Y is perpendicular to a plane of a circuit board of the memory 220. Thus, in the embodiments, the relative positions of the elements within the server 100 are more clearly understood. However, the corresponding arrangement among the elements in the server 100 is merely an example of the present document, which is not limited thereto.

In the embodiments, the memory case 230 includes a first case body 232 and a second case body 234. The first case body 232 includes a first extension part 232a extending in the first direction X (as depicted in FIG. 9). The second case body 234 includes a second extension part 234a extending in the first direction X (as depicted in FIG. 10). Further, the first extension part 232a is located on one side of the first case body 232, and the first case body 232 further includes a third extension part 232b (as depicted in FIG. 9) located on the other side of the first case body 232. The second extension part 234a is located on one side of the second case body 234, and the second case body 234 further includes a fourth extension part 234b (as depicted in FIG. 10) located on the other side of the second case body 234.

In the embodiments, the first case body 232 and the second case body 234 are combined in the second direction Y to form an interior space for accommodating the memory 220. In this case, the first extension part 232a fixes the second extension part 234a, and the third extension part 232b fixes the fourth extension part 234b. Specifically, the first extension part 232a and the second extension part 234a are fixed in the second direction Y, and the third extension part 232b and the fourth extension part 234b are also fixed in the second direction Y. The memory case 230 further includes a first screw set 230a and a second screw set 230b. The first screw set 230a locks the first extension part 232a and second extension part 234a in the second direction Y, and the second screw set 230b locks the third extension part 232b and fourth extension part 234b in the second direction Y. The memory case 230 further includes a third screw set 230c that locks the first case body 232 and the second case body 234 in the third direction Z. However, in some embodiments, the first case body 232 and the second case body 234 may also be combined in other directions, and methods for fixing the first case body 232 and the second case body 234 may further include clamping, tenons, or other means, and the present document is not limited thereto.

Referring to FIGS. 8 to 11, the memory case 230 further includes a first heat conducting pad 236 and a second heat conducting pad 238. The first heat conducting pad 236 is located on a first side of the first case body 232 relative to the interior space of the memory case 230, i.e., the inner surface of the first case body 232 as presented in FIG. 9. The second heat conducting pad 238 is located on a second side of the second case body 234 relative to the interior space of the memory case 230, i.e., the inner surface of the second case body 234 as presented in FIG. 10. When the memory case 230 accommodates the memory 220, the first heat conducting pad 236 is positioned between the first case body 232 and the memory 220, and the second heat conducting pad 238 is positioned between the second case body 234 and the memory 220. Specifically, when the memory case 230 accommodates the memory 220, first heat conducting pad 236 and second heat conducting pad 238 contact the memory 220 to quickly conduct the heat generated by the memory 220 to the first case body 232 and the second case body 234.

Figure 11:
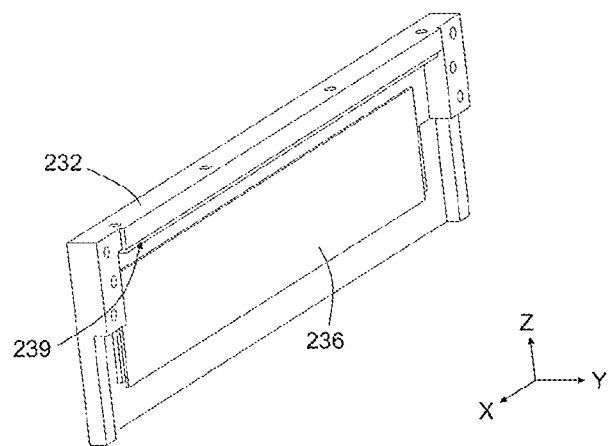
FIG. 11 is a schematic diagram of the first case body to which a first heat conducting pad and a shock absorbing pad are adhered according to some embodiments of the present document.

Further, referring to FIG. 11, the interior space of the memory case 230 has an inner surface. This inner surface is located, for example, at an upper edge turn of the first case body 232. Nonetheless, depending on the designs of the first case body 232 and the second case body 234, the inner surface may be defined as being located at an upper edge turn of the second case body 234. In the embodiments, the memory case 230 further includes a shock absorbing pad 239. The shock absorbing pad 239 is secured to the inner surface in the third direction Z. When the memory case 230 accommodates the memory 220, the shock absorbing pad 239 is positioned between the inner surface and the memory case 230 to provide cushioning between the memory 220 and the memory case 230 in an in-vehicle environment to reduce the possibility of damage to the memory 220.

Figure 15:
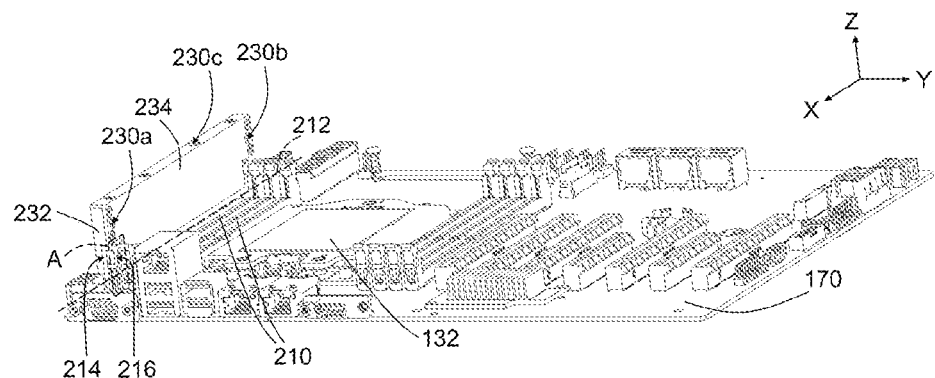

Referring to FIGS. 9, 10, and 15, in the embodiments, the length L1 of the first case body 232 in the third direction Z is different from the length L2 of the second case body 234 in the third direction Z. The length L1 is, for example, greater than the length L2, and the difference between the length L1 and the length L2 is such that a lower portion of the second case body 234 can be spliced with at least a portion of the memory slot 210. Specifically, the memory slot 210 has a first side surface 214 and a second side surface 216 on both sides of the central axis 212. The first case body 232 shields the first side surface 214, and the second case body 234 exposes an area A of the second side surface 216 (as shown in FIG. 15). That is, the second case body 234 can abut the upper edge of the memory slot 210 in the third direction Z without completely shielding the memory slot 210.

Figure 16:
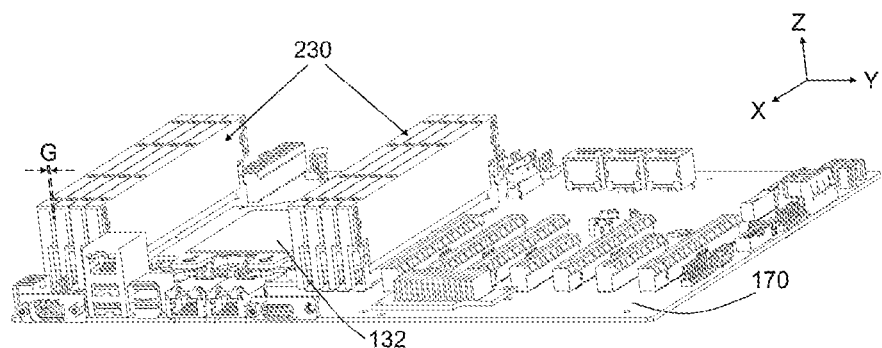

Referring to FIG. 16, in the embodiments, the housing 110 of the server 100 includes structures like the support module 120, hence the plurality of memory slots 210 on the main board 170 must be designed to be compact, and the plurality of memory modules 200 are arranged to be compact in parallel. Due to the narrow space between two memory slots 210, when the memory case 230 is installed to accommodate the memory 220, the space between the two memory slots 210 is insufficient to accommodate the wall thickness of the two cases that are snapped therein adjacent to the two memory cases 230. However, in the embodiments, since the second case body 234 does not need to completely shield the memory slot 210, the space between the two memory slots 210 needs only to accommodate the first case body 232 snapped therein, without the need to accommodate the second case body 234. That is, the design of the memory case 230 can be adapted to compactly arranged memory slots without overly narrowing the thickness of the first case body 232 and the second case body 234. When the plurality of memory modules 200 are mounted on the main board 170, a gap G between adjacent ones of the plurality of memory modules 200 in parallel and side by side is less than or equal to 0.5 mm. In other embodiments, the gap G between adjacent ones of the plurality of memory modules 200 in parallel and side by side may be of other values. In addition, the length L2 of the second case body 234 may be greater than the length L1 of the first case body 232, for example, so that the second case body 234 shields the second side surface 216 and the first case body 232 exposes the first side surface 214, which is not a limitation of the present document.

Figure 12:
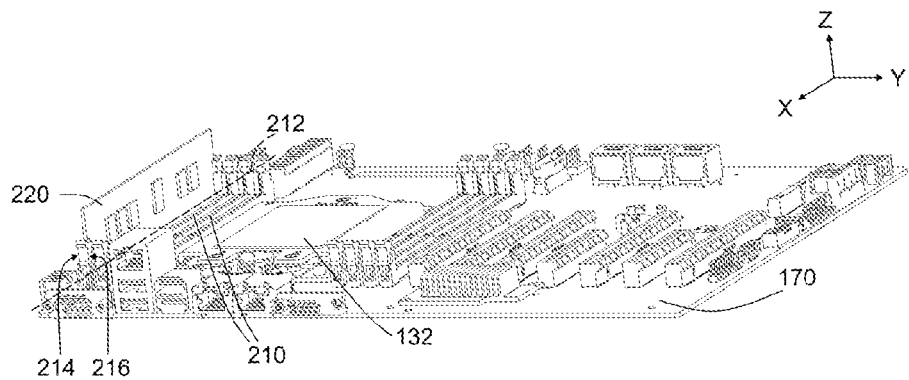
FIGS. 12 to 16 are structural diagrams of a memory case on a main board in a process of assembling according to some embodiments of the present document.
Figure 14:
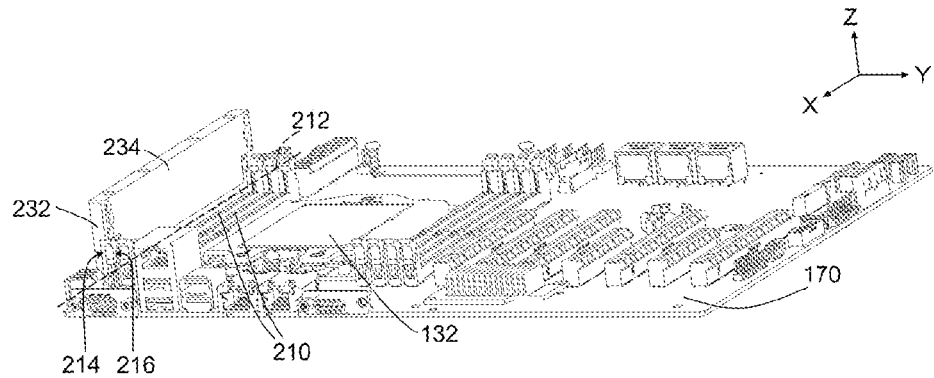

FIGS. 12 to 16 illustrate the process of mounting the memory case 230 on the main board 170 according to some embodiments of the present document. First, the memory 220 is snapped into the outermost memory slot 210 (FIG. 12). Next, the first heat conducting pad 236 is attached to an inner side of the first case body 232 of the memory case 230, and the shock absorbing pad 239 is attached to an upper inner surface of the first case body 232; the second heat conducting pad 238 is attached to an inner side of the second case body 234 of the memory case 230. Thereafter, the first case body 232 to which the first heat conducting pad 236 is attached is mounted on the memory 220 (FIG. 13), and the second case body 234 to which the second heat conducting pad 238 is attached is mounted on the memory 220 (FIG. 14). After this, the first screw set 230a, the second screw set 230b, and the third screw set 230c are respectively tightened (FIG. 15). Thus, the memory case 230 is mounted on the main board 170. Finally, sequentially, another memory case 230 is then mounted to an adjacent memory 220, for example, in the second direction Y, until the memory cases 230 as desired are all mounted to the main board 170 (FIG. 16).

Figure 2:
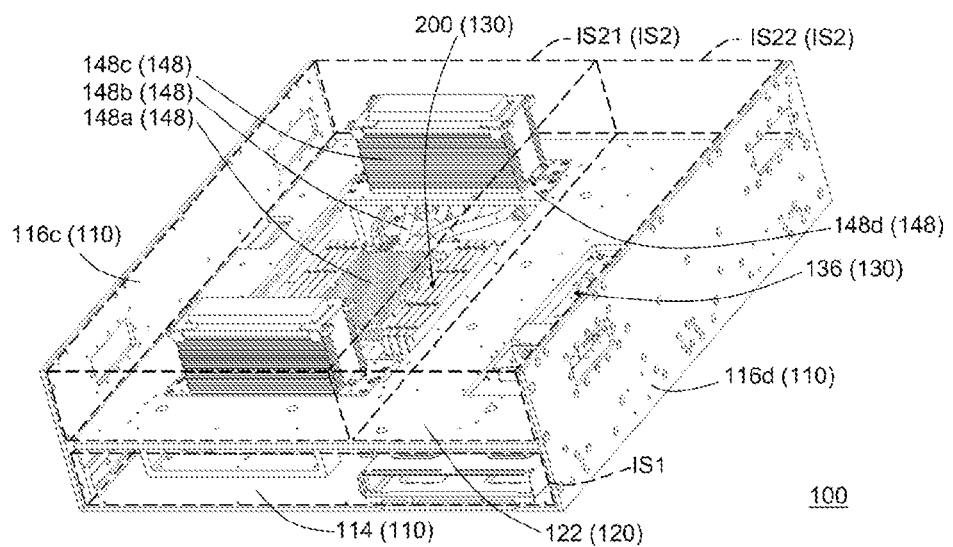

Referring to FIGS. 2 and 7, in the embodiments, the heat dissipating unit 140 further includes a processor heat dissipating unit 148. The processor heat dissipating unit 148 includes a heat conducting seat 148a, a heat conducting pipe 148b, and a heat dissipating module 148c. The heat dissipating module 148c is provided in the second space IS2, and the heat conducting seat 148a and the heat conducting pipe 148b are provided in the first space IS1. Specifically, the heat conducting seat 148a is mounted on the CPU 132, and the heat conducting pipe 148b connects the heat conducting seat 148a and the heat dissipating module 148c. The heat conducting seat 148a may include a base that contacts the CPU 132 and an upper cover. The number of the heat conducting pipes 148b may be one or more, and the base and the upper cover of the heat conducting seat 148a sandwich and fix the heat conducting pipe 148b so that the heat generated by the CPU 132 is conducted into the heat conducting pipe 148b. The heat conducting pipe 148b is filled with a heat conducting gel or a heat conducting liquid to conduct heat to the heat dissipating module 148c. The heat dissipating module 148c includes a plurality of heat dissipating fins to discharge heat to the second space IS2. In the embodiments, the number of the heat dissipating modules 148c is, for example, two, as shown in the drawings. Nonetheless, the number of the heat conducting pipes 148b and the number of the heat dissipating modules 148c may be appropriately configured according to actual requirements.

Referring to FIGS. 2 and 7, the processor heat dissipating unit 148 further includes a heat dissipating module bottom board 148d, and the heat dissipating module bottom board 148d carries the heat dissipating module 148c. An opening (the first opening O1) of the partition 122 accommodates the first heat sink 142 and the heat dissipating module bottom board 148d. Specifically, in the embodiments, the number of the heat dissipating modules 148c is two, and the number of the heat dissipating module bottom boards 148d is also two. Each heat dissipating module bottom board 148d carries a heat dissipating module 148c. The first opening O1 accommodates both the first heat sink 142 and the two heat dissipating module bottom boards 148d. Specifically, the lower board 114, the plurality of sidewalls, the partition 122, the first heat sink 142, and the heat dissipating module bottom boards 148d form the first space IS1.

Figure 4:
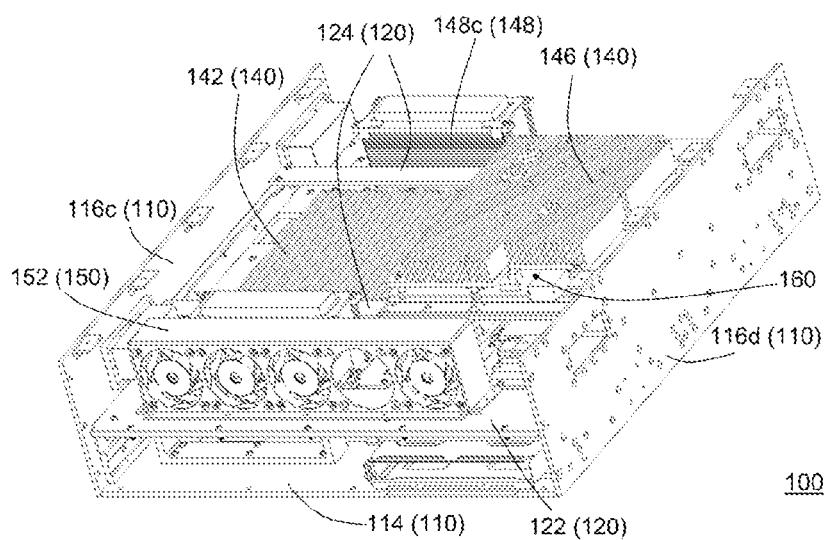
Figure 5:
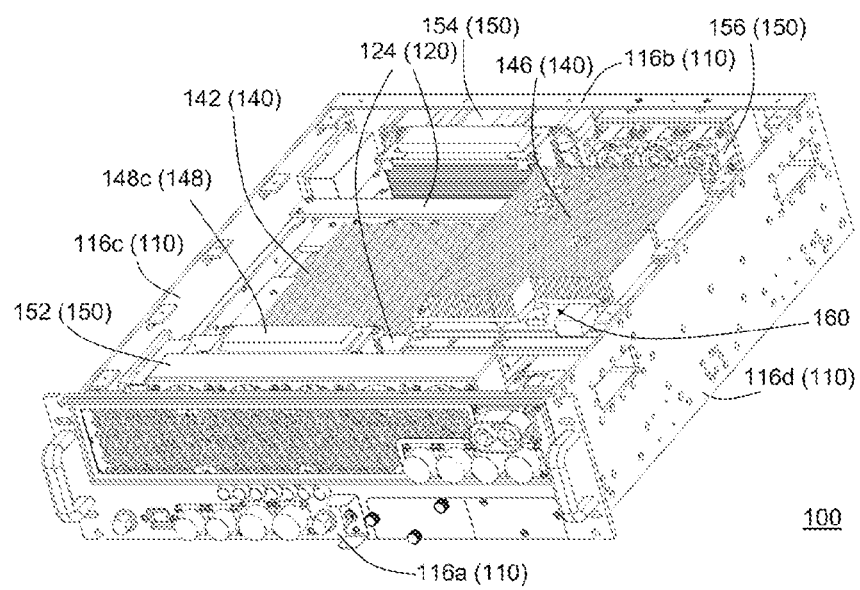
Figure 6:
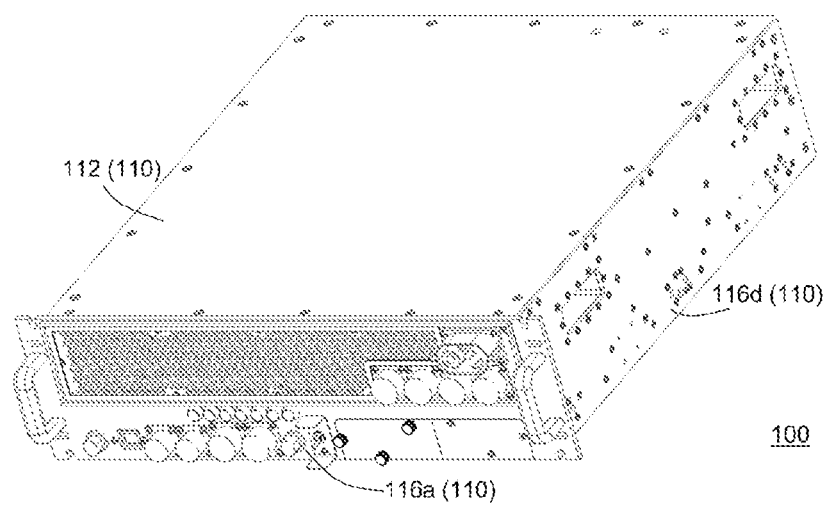

Referring to FIGS. 4, 5, and 7, the support module 120 further includes a first support 124 and a second support 126. The first support 124 is disposed between the partition 122 and the upper board 112, and the second support 126 is disposed between the partition 122 and the lower board 114. The heat-generating element set 130 further includes a network interface card 136 mounted on a daughterboard 180, and the second support 126 supports the daughterboard 180 above the main board 170. Referring to FIGS. 3 and 7, the heat dissipating unit 140 further includes a second heat sink 144, and the partition 122 further includes a second opening O2 for accommodating the second heat sink 144. When the second heat sink 144 is mounted into the second opening O2, the lower board 114, the plurality of sidewalls, the partition 122, the first heat sink 142, and the second heat sink 144 form the first space IS1. In some embodiments, the heat-generating element set 130 may also include a graphics processing unit (GPU) or a plurality of expansion cards mounted on the main board 170 or other boards in the first space IS1.

In the embodiments, the second heat sink 144 has a third surface S3 facing the first space IS1 and a fourth surface S4 facing the second space IS2. The fourth surface S4 of the second heat sink 144 has a second heat dissipating structure 144a, and the third surface S3 of the second heat sink 144 contacts the heat-generating element set 130 to dissipate heat from the heat-generating element set 130. Specifically, the third surface S3 of the second heat sink 144 contacts the network interface card 136 to dissipate heat from the network interface card 136. The second heat sink 144 may direct heat generated by the network interface card 136 to the second space IS2. In the embodiments, the second heat dissipating structure 144a is different from the first heat dissipating structure 142a, nonetheless, the second heat dissipating structure 144a may have the same structure as the first heat dissipating structure 142a according to actual requirements.

Referring to FIGS. 4, 5, and 7, in the embodiments, the server 100 further includes a power module 160 to provide a stable DC power supply for the server 100. The first support 124 supports the power module 160 such that the power module 160 is disposed between the first support 124 and the upper board 112. The heat dissipating unit 140 further includes a third heat sink 146 disposed on the power module 160. Specifically, the power module 160 and the third heat sink 146 are stacked above the second heat sink 144 cooling the network interface card 136, and the first heat sink 142 is disposed on the other side of the second space IS2. An upper space of the housing 110, that is, the second space IS2, includes a first portion IS21 and a second portion IS22 (see FIG. 3). A projection of the first portion IS21 on the upper board 112 does not overlap with a projection of the second portion IS22 on the upper board 112. The first heat sink 142 is within the first portion IS21 of the second space IS2, and the second heat sink 144 and the third heat sink 146 are within the second portion IS22 of the second space IS2.

With continued reference to FIGS. 4, 5, and 7, the server 100 further includes a fan set 150 disposed at a position on the housing 110 corresponding to the second space IS2 so as to dissipate heat from the second space IS2. The fan set 150 includes a first fan set 152, a second fan set 154, and a third fan set 156. The first fan set 152 is disposed on a first sidewall 116a of the plurality of sidewalls, and the second fan set 154 and the third fan set 156 are disposed on a second sidewall 116b of the plurality of sidewalls. Referring to FIGS. 3 and 4, the first fan set 152 corresponds to the first portion IS21 and the second portion IS22 of the second space IS2. Referring to FIGS. 3 and 5, the second fan set 154 corresponds to the first portion IS21 of the second space IS2, and the third fan set 156 corresponds to the second portion IS22 of the second space IS2.

Specifically, the first fan set 152, the second fan set 154, and the third fan set 156 are disposed in the second space IS2 so as to provide an air flow in the second space IS2, thereby discharging heat of the second space IS2 out of the housing 110 (chassis) of the server 100. In the embodiments, the second fan set 154 is positioned adjacent to the first heat sink 142 above the CPU 132 and the memory module 200 to dissipate heat from the first heat sink 142. The third fan set 156 is adjacent to the second heat sink 144 above the network interface card 136 and the third heat sink 146 above the power module 160 to dissipate heat from the second heat sink 144 and the third heat sink 146. In the embodiments, since there is a distance between the second sidewall 116b and the third heat sink 146, the third fan set 156 may be configured differently from the second fan set 154 in order to improve the heat dissipation efficiency of the third fan set 156. The third fan set 156 extends by a greater distance in the second space IS2 than a distance by which the second fan set 154 extends in the second space IS2. As such, the third fan set 156 is closer to the third heat sink 146 and closer to the second heat sink 144 to achieve better heat dissipation. However, the distance by which the third fan set 156 extends in the second space IS2 may also be set to be less than or equal to the distance by which the second fan set 154 extends in the second space IS2 according to actual requirements, and the present document is not limited thereto. In addition, the number of fans of the first fan set 152, the second fan set 154, and the third fan set 156 may be configured according to actual needs, and more fans may be provided at other locations of the server 100 to achieve a better heat dissipation effect.

In the embodiments, the heat sink (e.g., the first heat sink 142 and the second heat sink 144) and the support module 120 divide the interior space IS into the first space IS1 and the second space IS2, and the heat-generating element set 130 such as the CPU 132 and the memory module 200 are located in the closed first space IS1. The heat sink contacts the heat-generating element set 130 to dissipate heat from the heat-generating element set 130. Accordingly, the heat generated by the operation of the heat-generating element set 130 can be conducted into the second space IS2 through the heat sink, and the heat can be discharged out of the server 100 through the fan set 150 cooling the second space IS2. Since the heat-generating element set 130 such as the CPU 132 and the memory module 200 are located in the closed first space IS1 and are blocked by the support module 120 such as the partition 122, dust generated when the fan set 150 dissipates heat from the second space IS2 does not enter the heat-generating element set 130 in the first space IS1. This enables the prevention of dust from entering the heat-generating element set 130 while efficient dissipation of heat for the server 100 in an in-vehicle operation environment, thereby achieving a more stable operation of the server 100.

In the embodiments, the partition 122 of the support module 120 provides stability to the overall structure of the server 100. The first support 124 supports the overall structure of the housing 110 of the server 100 and also supports the power module 160. The second support 126 supports the daughterboard 180 above the main board 170. Specifically, the main board 170 is also provided with a plurality of supporting mechanisms to support elements and boards above and reduce the possibility of cantilevering the elements. The housing 110 and the support module 120 allow for various structural designs so that resonance of the server 100 in the in-vehicle vibration environment can be greatly reduced, whereby the server 100 in the in-vehicle operation environment can be more shock-resistant, and a more stable operation of the server 100 is ensured.

In addition, in the embodiments, since the length L1 of the first case body 232 of the memory case 230 of the memory module 200 in the third direction Z is different from the length L2 of the second case body 234 in the third direction Z, when the memory case 230 accommodates the memory 220 mounted on the memory slot 210, a shorter one of the first case body 232 and the second case body 234 in the third direction Z can abut against an upper edge of the memory slot 210, and there is no need to snap into the space between the memory slot 210 and other devices to shield the memory slot 210, so that the memory case 230 can be adapted to the interior of a server 100 having structural limitations, thereby achieving heat dissipation and dust prevention for the memory 220. In addition, since the first extension part 232a of the first case body 232 secures the second extension part 234a of the second case body 234, the mounted memory case 230 can retain sufficient structural strength to receive vibration in an in-vehicle environment, thereby achieving better operation of the server 100.

While exemplary embodiments or examples of the present document have been described with reference to the accompanying drawings, it is to be understood that the above exemplary discussion is not intended to be exhaustive or to limit the present document to the precise forms disclosed. Many modifications and variations are possible in light of the above teaching. Accordingly, the disclosed subject matter should not be limited to any single embodiment or example described herein, but rather should be construed in breadth and scope in accordance with the appended claims.

What is claimed is:

1. A memory case, wherein the memory case is configured to accommodate a memory mounted on a memory slot, the memory case comprising:
    a first case body comprising a first extension part extending in a first direction; and
    a second case body comprising a second extension part extending in the first direction, the first case body and the second case body being combined in a second direction to form an interior space for accommodating the memory, and the first extension part securing the second extension part, wherein:
        a length of the first case body in a third direction is different from a length of the second case body in the third direction, and
        the first direction, the second direction, and the third direction are perpendicular to each other.

2. The memory case according to claim 1, wherein the second direction is perpendicular to a plane of a circuit board of the memory.

3. The memory case according to claim 1, wherein the first extension part and the second extension part are fixed in the second direction.

4. The memory case according to claim 1, further comprising a first screw set, the first screw set locking to fix the first and the second extension parts.

5. The memory case according to claim 1, wherein:
    the first extension part is located on a side of the first case body, and the first case body further comprises a third extension part located on another side of the first case body;
    the second extension part is located on a side of the second case body, and the second case body further comprises a fourth extension part located on another side of the second case body, of which the third extension part secures the fourth extension part.

6. The memory case according to claim 5, further comprising a second screw set, the second screw set locking to fix the third and fourth extension parts in the second direction.

7. The memory case according to claim 1, further comprising a third screw set, the third screw set locking to fix the first and second case bodies in the third direction.

8. The memory case according to claim 1, further comprising:
a first heat conducting pad located on a first side of the first case body relative to the interior space, and
a second heat conducting pad located on a second side of the second case body relative to the interior space, wherein
the first heat conducting pad is located between the first case body and the memory, and
the second heat conducting pad is located between the second case body and the memory in response to the memory case accommodating the memory.

9. The memory case according to claim 8, wherein the first heat conducting pad and the second heat conducting pad contact the memory in response to the memory case accommodating the memory.

10. The memory case according to claim 1, wherein the interior space has an inner surface, and the memory case further comprises a shock absorbing pad secured to the inner surface in the third direction, the shock absorbing pad being positioned between the inner surface and the memory in response to the memory case accommodating the memory.

11. A server, comprising:
a main board; and
at least one memory module mounted on the main board, the at least one memory module comprising:
a memory slot;
a memory mounted on the memory slot; and
a memory case accommodating the memory, the memory case comprising:
a first case body comprising a first extension part extending in a first direction; and
a second case body comprising a second extension part extending in the first direction, the first case body and the second case body being combined in a second direction to form an interior space for accommodating the memory, and the first extension part securing the second extension part, wherein:
a length of the first case body in a third direction is different from a length of the second case body in the third direction, and
the first direction, the second direction, and the third direction are perpendicular to each other.

12. The server according to claim 11, wherein:
the at least one memory module comprises a plurality of memory modules, and
the plurality of memory modules are parallel and side-by-side.

13. The server according to claim 12, wherein a gap between adjacent ones of the plurality of parallel and side-by-side memory modules is 0.5 mm or less.

14. The server according to claim 11, wherein:
the memory slot has a first side surface and a second side surface on both sides of a central axis, and
the central axis is parallel to a mounting direction in which the memory is mounted in the memory slot, the first case body shielding the first side surface, the second case body exposing the second side surface.

15. The server according to claim 11, further comprising a chassis, a partition, a heat sink, and a fan set, the partition and the heat sink dividing a chassis space of the chassis into an upper space and a lower space, wherein:
the main board and the at least one memory module are located in the lower space,
the heat sink conducts heat of the at least one memory module to the upper space, and
the fan set discharges heat of the upper space out of the chassis.

* * * * *